United States Patent [19]
Andresen et al.

[11] Patent Number: 6,147,538
[45] Date of Patent: Nov. 14, 2000

[54] CMOS TRIGGERED NMOS ESD PROTECTION CIRCUIT

[75] Inventors: Bernhard H. Andresen, Dallas; Roger A. Cline, Plano, both of Tex.

[73] Assignee: Texas Instruments Incorporated, Dallas, Tex.

[21] Appl. No.: 09/325,530

[22] Filed: Jun. 3, 1999

[51] Int. Cl.$^7$ ...................................................... H03K 5/08
[52] U.S. Cl. ............................ 327/309; 327/313; 327/566; 361/56
[58] Field of Search ..................................... 327/309, 310, 327/313, 314, 321, 564, 566; 361/56, 91, 111

[56] References Cited

U.S. PATENT DOCUMENTS

| | | | |
|---|---|---|---|
| 4,855,620 | 8/1989 | Duvvury et al. | 307/448 |
| 4,896,243 | 1/1990 | Chatterjee et al. | 362/91 |
| 5,208,719 | 5/1993 | Wei | 361/56 |
| 5,345,356 | 9/1994 | Pianka | 361/56 |
| 5,404,041 | 4/1995 | Diaz et al. | 257/360 |
| 5,450,267 | 9/1995 | Diaz et al. | 361/56 |
| 5,468,667 | 11/1995 | Diaz et al. | 437/50 |
| 5,508,649 | 4/1996 | Shay | 327/318 |
| 5,528,188 | 6/1996 | Au et al. | 327/310 |
| 5,637,892 | 6/1997 | Leach | 257/362 |
| 5,663,678 | 9/1997 | Chang | 327/566 |
| 5,956,219 | 9/1999 | Maloney | 361/56 |

OTHER PUBLICATIONS

Singh, Gajendra, et al; Sun Microsystems, Inc./Silicon Technology Development, Texas Instruments, *4kV ESD Protection for Mixed Voltage IOs om a 400 MHz Microprocessor*, presented at DesignCon '99, Jan., 1999, 2 pages.

Amerasekera, Ajith & Duvvury, Charvaka, ESD in Silicon Integrated Circuits (1995); pp. 55–134.

Ramaswamy, S., et al; EOS/ESD Reliability of Deep Sub–Micron NMOS Protection Devices, Int'l Reliability Physics Symposium (IRPS) (1995).

Ramaswamy, S., et al.; EOS/ESD Analysis of High–Density Logic Chips, Univ. of Ill/Texas Instruments Incorporated, unnumbered and undated.

Duvvury, C., et al.; ESD: A Pervasive Reliability Concern for IC Technologies, vol. 81, No. 5, Proc. IEEE, May 1993, pp. 691–702.

*Primary Examiner*—Timothy P. Callahan
*Assistant Examiner*—An T. Luu
*Attorney, Agent, or Firm*—Gerald E. Laws; W. James Brady, III; Frederick J. Telecky, Jr.

[57] ABSTRACT

An integrated circuit is provided with electrostatic discharge (ESD) protection circuitry (120) A substrate region in the semiconductor substrate is enclosed by a ring of highly doped region (350). An NMOS ESD protection transistor (N1) with its backgate in the enclosed substrate region can be voltage pumped by pump circuitry (N2) in order to trigger bipolar conduction of the ESD protection transistor at a lower voltage. Control circuitry (304) is connected to the signal bond pad and to the gate of amplifier circuitry (P1) to provide a voltage pulse in response to an ESD zap applied to the signal bond pad. PMOS amplifier circuitry (P1) provides an amplified voltage pulse to the pump circuitry with a magnitude approximately equal to the ESD potential on the signal pad so that a strong pump current is provided to the highly doped ring.

10 Claims, 4 Drawing Sheets

CMOS TRIGGERED NMOS ESD PROTECTION CIRCUIT

FIELD OF THE INVENTION

The present invention relates to Electrical Over-Stress (EOS) and Electrostatic Discharge (ESD) protection in high density integrated circuits.

BACKGROUND OF THE INVENTION

Modern integrated circuits are easily damaged by excess voltages, and one common source of such potentially damaging voltages is caused when two materials are rubbed together. A person can develop very high static voltage, from a few hundred to several thousand volts, simply by walking across a room or by removing an IC from its plastic package, even when careful handling procedures are followed. The impact of ESD damage due to handling and testing can have a significant influence on product yield. Large ICs manufactured in advanced processes may only have 30 to 40 chips per six inch wafer. Any product loss due to ESD damage has a direct impact on profitability and even fall-outs of the order of 1% are not acceptable. Another issue which gives increasing importance to ESD control is the move towards replaceable ICs in electronic systems. Instead of replacing the whole circuit board, as used to be the standard practice, users are now encouraged to purchase upgrades to their microprocessors and memory cards and perform the installation themselves. Since the installation does not necessarily take place in an ESD-safe environment, the ICs need to be ESD robust.

The major source of ESD exposure to ICs is from the human body, and is known as the Human Body Model (HBM) ESD source. A charge of about 0.6 C can be induced on a body capacitance of 150 pF, leading to electrostatic potentials of 4 kV or greater. Any contact by a charged human body with a grounded object, such as the pin of an IC, can result in a discharge for about 100 ns with peak currents of several amperes to the IC.

A second source of ESD is from metallic objects, and is known as the machine model (MM) ESD source. The MM ESD source is characterized by a greater capacitance and lower internal resistance than the HBM ESD source. The MM ESD model can result in ESD transients with significantly higher rise times than the HBM ESD source.

A third ESD model is the charged device model (CDM). Unlike the HBM ESD source and the MM ESD source, the CDM ESD source includes situations where the IC itself becomes charged and discharges to ground. Thus, the ESD discharge current flows in the opposite direction in the IC than that of the HBM ESD source and the MM ESD source. CDM pulses also have very fast rise times compared to the HBM ESD source.

A longstanding problem is that if such a high voltage is accidentally applied to the pins of an IC package, the discharge can cause gate oxide breakdown of the devices to which it is applied. The breakdown may cause immediate destruction of the device, or it may weaken the oxide enough such that failure may occur early in the operating life of the device and thereby cause later device failure in the field.

In MOS integrated circuits, the inputs are normally connected to drive the gate of one or more MOS transistors. The term "MOS" is used in this application, as is now conventional, to refer to any insulated-gate-field-effect-transistor, or to integrated circuits which include such transistors. Furthermore, all pins are provided with protective circuits to prevent voltages from damaging the MOS gates. These protective circuits, normally placed between the input and output pads on a chip and the transistor gates to which the pads are connected, are designed to begin conducting, or to undergo breakdown, thereby providing an electrical path to ground (or to the power-supply rail) when excess voltage occurs. Such protection devices are designed to avalanche (passing a large amount of current, and dissipating the energy of the incoming transient) before the voltage on the input pin can reach levels which would damage the gate oxide. Since the breakdown mechanism is designed to be nondestructive, the protective circuits provide a normally open path that closes only when the high voltage appears at the input or output terminals, harmlessly discharging the node to which it is connected.

However, technological advances are leading to the creation of smaller and faster components that are increasingly more fragile. The output stages of MOS circuits which, until now, have been capable of withstanding high discharge currents, are becoming more vulnerable. In particular, the advantages of the various techniques for improving the performance characteristics of integrated circuits are offset by increased sensitivity to over-voltages or discharges. Breakdown voltages of the junctions or punch-through voltages between drain and source of the MOS transistors are becoming lower and the gate oxide is more fragile.

ESD protection for MOS output buffers has typically relied on a parasitic lateral bipolar transistor of the MOS devices. When the voltage reaches the breakdown voltage of the devices, the lateral transistors should turn on and clamp the pad voltage at a sufficiently low voltage to protect the output buffer. The devices typically have a snap-back characteristic during breakdown. The parasitic transistor triggers at a high voltage and snaps-back to a lower voltage to clamp the pad voltage. However, a portion of the MOS device can trigger and snap-back to a lower voltage and conduct all of the current. When this happens, this part can be destroyed before the voltage rises high enough to trigger the rest of the device. This is especially a problem for devices with low resistance substrates, since the substrate is the base of the parasitic lateral transistors and the base is difficult to forward bias if it is low resistance. Low resistance substrates are desirably used on CMOS circuits to prevent latchup of parasitic SCRs in normal operation, however, this conflicts with the use of SCRs for ESD protection.

As integrated circuits (ICs) become more complicated and, as a result, denser, the metal-oxide-semiconductor (MOS) circuit elements that make up the IC must become smaller. As the size of a MOS circuit element shrinks, its operating voltage also tends to drop. In the past, the standard operating voltage of MOS circuit elements was 5 V. Newer designs are using operating voltages in the 2.5 to 3.3 volt range. For compatibility, it is desirable for the newer designs to be able to withstand 5 V signals. Unfortunately, technologies developed for 3 V operation have thin gate oxides, on the order of 100 angstroms. If a thin oxide device designed for 3 V operation were instead operated at 5 V, the device would have accelerated wear-out due to reduced gate oxide reliability.

ESD protection circuits using MOS circuit elements must be designed to avoid having the oxides stressed by a 5 V bond pad voltage during normal operation. At the same time, the protection circuit must turn-on and provide good ESD protection during ESD stress. One prior art solution uses two gate oxide thicknesses. A thinner oxide is used for the internal functional circuitry and a thicker oxide is used for circuitry connected directly to a bond pad. Unfortunately, this adds process complexity by requiring two gate oxide formations. Thus, there is a need for ESD protection circuitry that will not be stressed during 5 V operation and that minimizes process complexity.

Because of the importance of ESD protection, it is desirable to improve and provide alternative ESD protection circuits.

Other objects and advantages will be apparent to those of ordinary skill in the art having reference to the following figures and specification.

SUMMARY OF THE INVENTION

In general, and in an embodiment of the present invention, an integrated circuit is provided with ESD protection circuitry having amplifier circuitry to increase substrate pump current in response to an ESD event. The integrated circuit has a semiconductor substrate with a bond pad for a reference supply voltage and a signal bond pad for connecting to an external signal. The ESD circuitry is connected between the signal pad and the reference supply voltage bond pad. The ESD circuitry has a substrate region in the semiconductor substrate enclosed by a highly doped region, with a first MOS transistor of a first conductivity type with a backgate in the first substrate region, a first source/drain connected to the signal bond pad, a second source/drain connected to the reference supply voltage bond pad, and a control gate connected to the highly doped region. There is a complimentary triggering MOS transistor of a second conductivity type with a first source/drain connected to the signal bond pad, a second source/drain connected to the highly doped region, and a control gate. Control circuitry is connected to the first signal bond pad and to the control gate of the second MOS transistor and is operable to provide a control signal to the control gate of the complimentary triggering MOS transistor in response to an ESD zap applied to the first signal bond pad.

In accordance with another aspect of the present invention, a second triggering MOS transistor has a first source/drain connected to the signal bond pad, a second source/drain connected to the control gate of the second MOS transistor, and a control gate connected to the complimentary triggering transistor.

In accordance with another aspect of the present invention, the control circuitry has an R/C timing circuit to control the length of the voltage pulse applied to the control gate of the triggering transistors.

In accordance with another aspect of the present invention, the first MOS transistor and the triggering MOS transistor can be cascode connected transistors.

Other embodiments of the present invention will be evident from the description and drawings.

BRIEF DESCRIPTION OF THE DRAWINGS

Other features and advantages of the present invention will become apparent by reference to the following detailed description when considered in conjunction with the accompanying drawings, in which.

Corresponding numerals and symbols in the different figures and tables refer to corresponding parts unless otherwise indicated.

DETAILED DESCRIPTION OF EMBODIMENTS OF THE INVENTION

Figure 1:
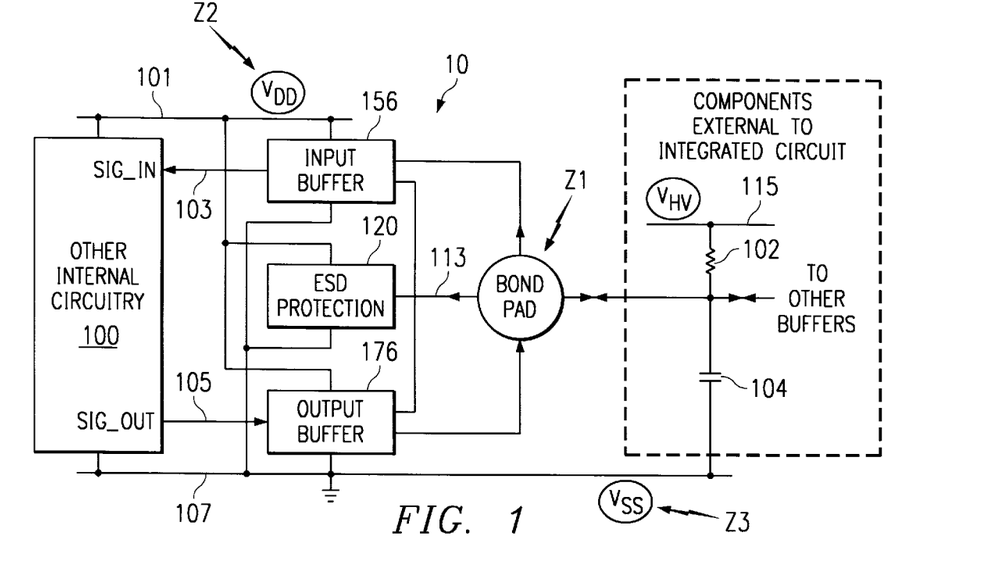
FIG. 1 is a schematic diagram of an integrated circuit with improved ESD protection, according to an aspect of the present invention.

A block diagram of an integrated circuit 10 with an input/output buffer system is shown in FIG. 1. A normal operating supply voltage of 5 volts is connected between positive terminal $V_{DD}$ node 101, and $V_{SS}$ reference terminal 107. Reference terminal 107 is typically connected to ground, or 0 volts. Components that are external to the integrated circuit are shown in the dashed box. An external voltage ranging from 0 to 5 volts is applied to the bond pad of the buffer from external high voltage supply, VHV, node 115, through external resistor 102. Note that component 102 is not necessarily a resistor but can be any device that limits the current from the 5 volt external supply to the maximum value allowed in the system specifications.

External component 104 is a capacitor representing the maximum capacitive system load that an output buffer must discharge to meet its specified timing requirements in the application. Internal signals are generated in the Other Internal Circuitry block 100 which sends logic signals to an output buffer block 176 and/or receives logic signals from an input buffer block 156.

Input/output buffer bond pad 113 is driven by an output buffer block 176, and the bond pad also supplies a signal to an input buffer block 156, thereby functioning bidirectionally. Other buffers external to this integrated circuit may be present in the system. The voltage at the bond pad 113 will be at a level between 0 volts and 5 volts at any time, either due to the operation of output buffer block 176 or an output buffer external to the integrated circuit.

The Other Internal Circuitry block 100 represents the remainder of the integrated circuit components and is responsible for processing the signals to and from the input/output circuitry at this bonding pad.

The input/output buffer 156/176 and internal circuitry 100 are advantageously improved and protected from an ESD (electrostatic discharge) event Z1–Z3 to any of the bond pads or pins of the chip by the provision of ESD protection circuitry 120. Aspects of the present invention relate to protecting against zap Z1 on the signal bond pad 113. Zaps on $V_{DD}$ power pad 101 and $V_{SS}$ pad 107 are protected against by various diodes, transistors, and resistors, such as described in U.S. Pat. No. 5,637,892, entitled "Electrostatic Discharge Protection in Integrated Circuits, Systems, and Methods," and incorporated herein by reference.

An ESD event is called a "zap" herein because some ESD causes a pulse, spark or sound which the word "zap"

concisely represents. ESD zaps can occur from static electricity discharges from persons installing or removing an integrated circuit chip. Also, any sudden discharge or other undesirable potential difference applied to the chip due to a surge in an industrial, office, home or field environment can be an ESD event of interest herein.

Before an ESD zap, the bond pads for $V_{DD}$ in FIG. 1 are initially at 0 volts due to substrate leakage currents. If output pad 113 is zapped positive by zap Z1 with $V_{SS}$ terminal 107 as reference, transistor ESD circuitry 120 is triggered and clamps the voltage on output pad 113 to a value that is less then a breakdown voltage of I/O buffers 156/176.

A key issue for ESD design is to ensure the ESD protection circuit 120 turns on with a small on-resistance so as to conduct most of the ESD current during an ESD event. A trigger element with a low trigger voltage is required for such an ESD protection scheme. In advanced submicron BiCMOS processes, a zener breakdown voltage of about a base-emitter junction of a bipolar junction transistor (BJT) is utilized for that purpose. In advanced submicron CMOS processes, this option is not available. The lowest junction breakdown voltage is known as the NMOS drain junction breakdown voltage. Therefore, the characteristics of an NMOS device in a particular process dictate the ESD protection design.

Figure 2:
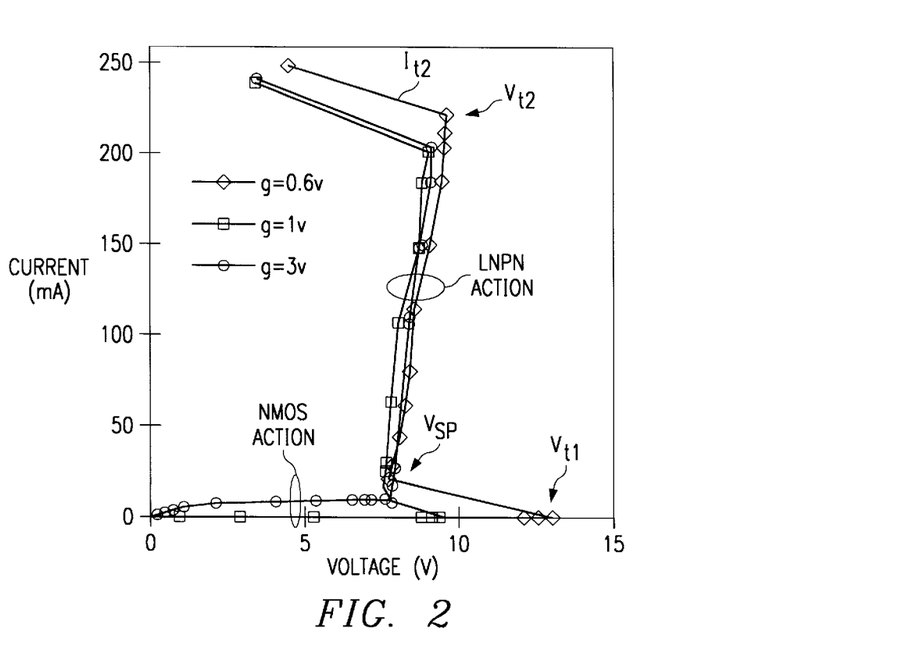
FIG. 2 illustrates graphs of current vs. voltage of a typical I–V breakdown characteristic for an NMOS transistor under different gate bias conditions.

FIG. 2 illustrates graphs of current (I) (in milliamps) vs. voltage (in volts, V) of a typical I–V breakdown characteristic for an NMOS transistor under different gate bias conditions as measured in a TLP system with a 200 ns pulse width. Vt1 is the first turn-on voltage of a parasitic lateral npn (LNPN) transistor associated with the NMOS transistor. Vt2 is the second breakdown voltage and Vsp is the snapback voltage. Beyond the second breakdown which is signified by Vt2, the NMOS enters the regime of thermal runaway which can result in damage to the NMOS. The corresponding second breakdown current (It2) is the corresponding current for Vt2 on the I–V characteristic shown in FIG. 2, is a key process ESD parameter for monitoring the high current handling capability of the NMOS. When the NMOS operates in the snapback mode or the bipolar breakdown region, the lateral NPN (LNPN) of the NMOS conducts most of the drain terminal current. It has been found that It2 strongly depends on the Beta of the LNPN, the NMOS channel length, the silicide thickness, the drain junction depth, and the epi layer thickness. An improved It2 can result from an optimized process. For a given process, the success of a typical multi-finger NMOS protection design strictly depends on how to design a protection circuit to enable most of the LNPNs, which are the NMOS fingers of a protection NMOS scheme, to turn on and uniformly conduct ESD current during ESD events. Uniformity in turning on the LNPNs (or NMOS fingers) can be achieved by increasing snapback on-resistance (Ron) to increase Vt2 to being greater than Vt1 or by reducing Vt1 to being less than Vt2. If Vt1 is designed to be lower than Vt2, each LNPN of a NMOS finger would, during an ESD event, turn on to conduct the ESD current before any single LNPN reaches second breakdown, Vt2.

On-resistance, Ron, can be easily increased by increasing the drain/source contact to poly gate spacing in non-silicided processes. But in silicided processes, a silicide block mask is needed in order to get a good ESD protection performance. Increasing substrate potential or applying a small positive bias voltage to the substrate can reduce Vt1 below Vt2. "Pumping" of the substrate aids turn on of the bipolar structure, as described in U.S. patent application Ser. No. 08/795,935 (TI-19439), entitled "Improved Semiconductor ESD Protection Circuit" and incorporated herein by reference. The reduction of Vt1 can also be achieved by increasing the NMOS gate potential. As shown in FIG. 2 by the curve represent a gate voltage of 3 v, when the gate voltage is high enough, Vt1 is approximately Vsp, which is less than Vt2.

An ESD protection circuit described in U.S. patent application Ser. No. 09/025,916 (TI-21331), entitled "PNP Driven ESD Protection Circuit" and incorporated herein by reference, is a PNP triggered NMOS (PTNMOS) structure. The PTNMOS structure has a robust pump of the substrate, but it requires a clamp diode to a power rail limiting its use in failsafe applications. Failsafe operation refers to a condition in which $V_{DD}$ is removed from a circuit, for power down for example, but an active signal is still impressed on a signal bond pad, due to continued operation of interconnected circuits that remain powered, for example.

An ESD protection circuit described in U.S. patent application Ser. No. 08/295,435 (TI-19439) entitled "Improved Semiconductor ESD Protection Circuit" and incorporated herein by reference is an NMOS triggered NMOS (NTNMOS) structure. The NTNMOS structure is failsafe, but the substrate pumping action may be marginal.

It has now been found that a new structure using both PMOS and NMOS devices in the pump mechanism greatly amplifies the substrate pump action. This will be referred to herein as a CMOS triggered NMOS (CTNMOS) structure.

Figure 3:
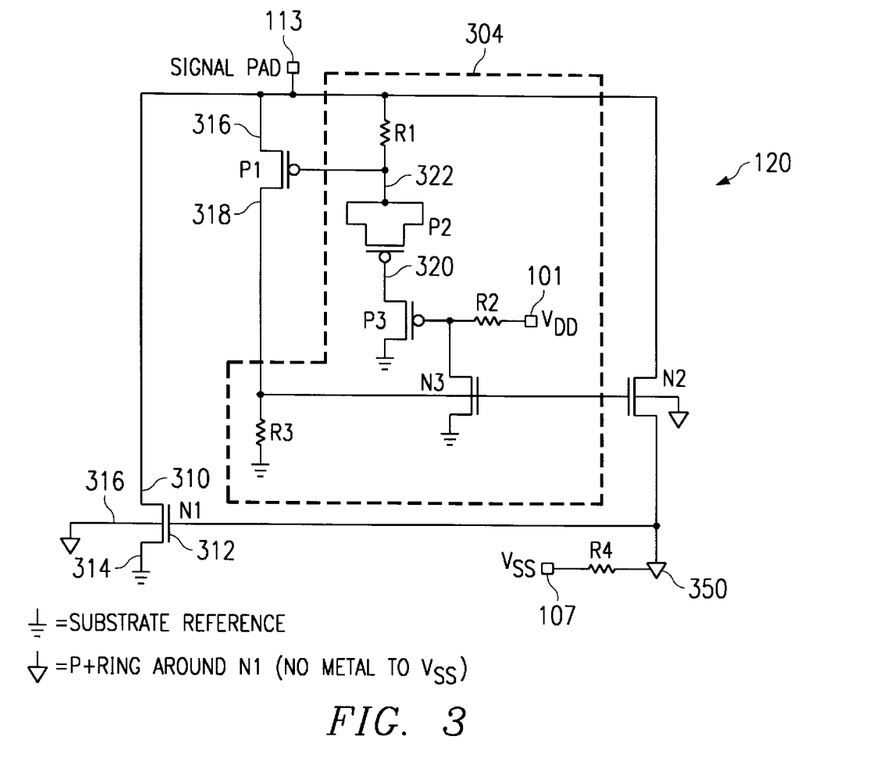
FIG. 3 is a schematic diagram of the ESD protection circuitry of FIG. 1.

FIG. 3 is a schematic of ESD protection circuitry 120, according to an aspect of the present invention. N1 forms a gate coupled device (GCD) which operates in bipolar snapback to protect other circuits. The width of transistor N1 is set by $I_{T2}$ of the process. When an electrostatic discharge is received at bond pad 113, a high voltage initially appears on drain 310 of NMOS transistor N1. Due to capacitive coupling between drain 310 and gate electrode 312, and also due to pump current provided by pump transistor N2, the voltage will quickly rise on gate electrode 312 as well. Source 314 of transistor N1 is connected to $V_{SS}$ reference voltage pad 107. The pad voltage on bond pad 113 rises until the breakdown voltage of MOS transistor N1 is reached. Allowing gate electrode 312 to attain a potential during an electrostatic discharge causes a lowering of the breakdown voltage of MOS transistor N1 compared to the breakdown voltage that would result if gate electrode 312 was connected to ground. Once the breakdown voltage of N1 is reached, then the voltage on bond pad 113 decays to a level of the snapback holding voltage of NMOS transistor N1.

Control circuitry 304 is connected to signal bond pad 113 and to the gate of a PMOS amplifier transistor P1. In this embodiment, pump transistor N2 is a triggering transistor and amplifier transistor P1 is a complimentary triggering transistor. Control circuitry 304 is operable to provide a voltage pulse to the gate of P1 in response to an ESD zap applied to signal bond pad 113 so that ESD protection transistor N1 is triggered to operate in bipolar snap back mode to protect buffer circuitry 156/176. After triggering N1, control circuitry 304 reduces the voltage pulses applied to the gate of P1 and thereby to the gates of N2 and N3 before the gate oxide of these transistors is damaged.

Source 316 of PMOS amplifier transistor P1 is connected to signal pad 113. Drain 318 of PMOS amplifier device P1 is connected to and drives gates of NMOS devices N2 and N3 high during an ESD zap. NMOS device N2 is a source follower substrate pump that is connected to a P+ ring 350 in the semiconductor substrate. P+ ring 350 surrounds main ESD device N1 and encloses a substrate region in which device N1 is formed. This ring is not hard wired to $V_{SS}$ reference pad 107, rather it sees a resistance R4 due to the resistance the semiconductor substrate. On a positive ESD strike, transistor N2 pumps the ring and substrate region around device N1 to help initiate bipolar conduction of transistor N1, so that main ESD protection device N1 goes into bipolar breakdown during an ESD zap.

PMOS device P2 is used as a capacitor and forms an R/C timing circuit in conjunction with resistor R1 to turn off transistor P1 after N1 is triggered in response to an ESD zap. Capacitor P2 is connected to the $V_{SS}$ reference via PMOS transistor P3. When an ESD zap first occurs, a lower plate 320 of capacitor P2 has a potential approximately equal to $V_{SS}$. An upper plate 322 of capacitor P2 is connected to the gate of transistor P1. A gate capacitance of transistor P1 and other intrinsic capacitance associated with signal traces connected to upper plate 322 are effectively in parallel with capacitor P2 and act with capacitor P2 to keep the gate of transistor P1 at approximately $V_{SS}$, during the initial application of the ESD zap. Thus approximately the full value of the ESD zap is applied as a gate-source voltage to transistor P1, and transistor P1 is thereby quickly turned on in response to an ESD zap. Transistor P1 in turn applies approximately the full potential on bond pad 113 to the gate of pump transistor N2. Advantageously, transistor N2 conducts strongly, in the range of 100–200 milliamps, so that a potential applied to P+ ring 350 and also to gate 312 of ESD device N1 also approaches the potential applied to signal pad 113 by the ESD zap. A backgate 316 of transistor N1 is formed in the substrate region enclosed by P+ ring 350. Thus, a voltage potential on backgate 316 is also raised and ESD transistor N1 quickly transitions into bipolar conduction mode in response to an ESD zap on signal pad 113. Capacitor P2 and resistor R1 are sized to provide an R/C time constant that turns off transistor P1 after ESD device enters into bipolar conduction and before damage occurs in the gate oxide of transistors P1, N2 and N3.

Still referring to FIG. 3, PMOS transistor P3 acts as a switch to deactivate P1 when $V_{DD}$ comes on during normal operation of integrated circuit 10. Resistor R3 likewise keeps transistors N2 and N3 turned off during normal operation of integrated circuit 10. Transistor N3 acts as a switch to maintain P1 on during an ESD event, even if $V_{DD}$ comes up, until R1 and P2 turn off P1.

The backgates of PMOS devices P1 and P3 are connected to signal pad 113.

Advantageously, using a complimentary triggering transistor in the form of an amplifier (P1) to drive the source follower (N2) instead of a passive element, such as a capacitor, boosted the gate voltage of N2 from 2 volts to over 5 volts during an ESD event. Substrate pump current is increased by an order of magnitude, as compared to an equivalent NTNMOS structure since virtually all of a first portion of the ESD zap is diverted into P+-ring 350 due to the amplifying action of transistor P1.

Figure 4:
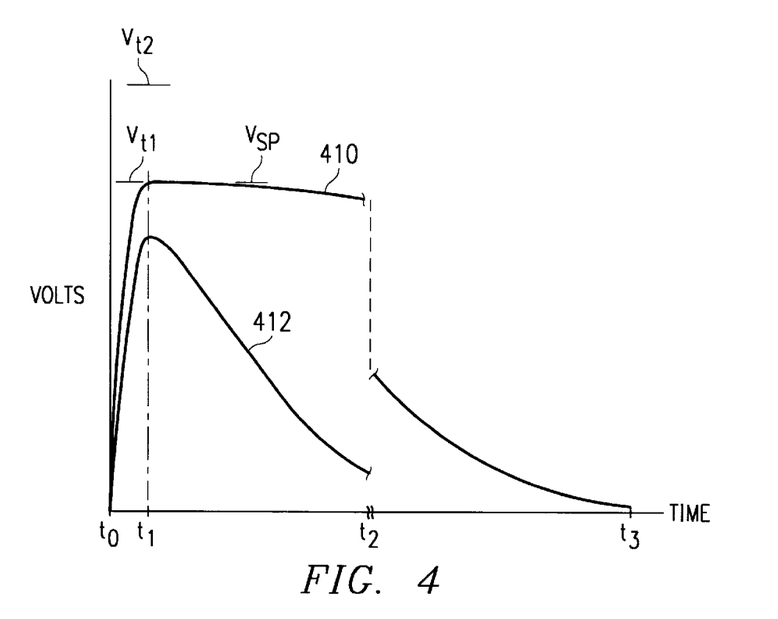
FIG. 4 illustrates operation of the ESD protection circuitry of FIG. 3 during an ESD zap event.

FIG. 4 illustrates operation of ESD protection circuitry 120 during an ESD zap event. At the onset of an ESD zap at time $t_0$, voltage on signal pad 113 starts to rapidly rise, as indicated by curve 410. Simultaneously, a gate-source voltage on transistors N2 starts to rise due to zap voltage transferred by amplifier transistor P1 as represented by curve 412. At time $t_1$, transistor N1 is triggered into bipolar conduction after reaching trigger voltage $V_{t1}$. Transistor N1 must be triggered into bipolar conduction before voltage on pad 113 reaches a level that will damage the gate oxide of any transistor on integrated circuit 10. Time $t_1$ is typically less than 15 ns, and is preferably less than 5 ns. Due to the resulting high current flow of approximately 2–3 amps through transistor N1, voltage on signal pad 113 is maintained at approximately the snap back voltage $V_{sp}$ of transistor N1. This voltage level is maintained until the energy of the zap is expended at time $t_2$ and then decays to nothing after time $t_3$, which is typically 150–250 ns. After time $t_1$, gate-source voltage 312 decays due to the action of R/C circuitry R1/P2.

Figure 5:
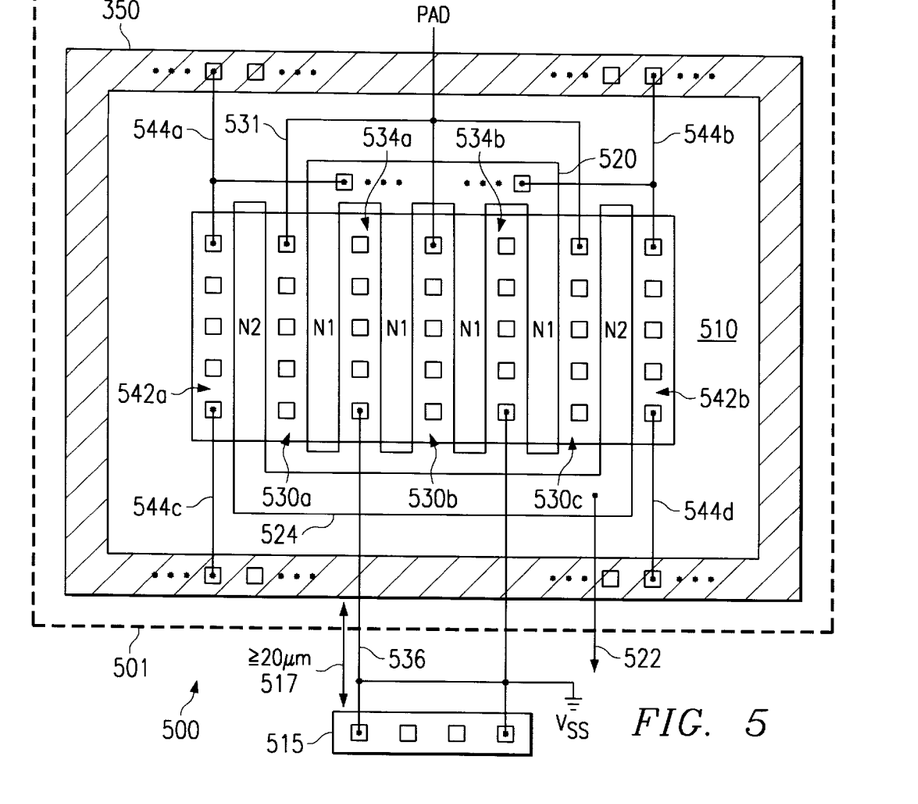
FIG. 5 is a topological diagram of the main ESD protection transistor and pump transistor of the ESD protection circuitry of FIG. 3.

FIG. 5 is a topological diagram of transistors N1, and N2. Only a portion of semiconductor substrate 500 is depicted. Remaining circuitry of integrated circuit 10 is formed on portions of semiconductor substrate 500 not shown. A p-well 501 is formed within the substrate and contains the ESD structure. The impurity concentration of p-well 501 is selected to optimize the transistor characteristics of the ESD protection structure, however, the CTNMOS protection structure according to aspects of the present invention is tolerant of a wide range of p-type impurity concentration in p-well 501. P+ ring 350 encloses a region 510 of the semiconductor substrate. P+ ring 350 is not tied to the $V_{SS}$ reference bond pad. P+ substrate contacts, such as contact 515, are spaced apart from P+ ring 350 a distance 517 so that region 510 can be voltage pumped by pump transistor N2, as discussed earlier. In this embodiment, distance 517 is a minimum of 20 microns, however, in other embodiments distance 517 would be scaled to provide sufficient resistance between substrate contact 515 and P+ ring 350 to permit voltage pumping of region 510. Transistors N1 is formed within the region 510 so that its backgate can be voltage pumped by pump transistor N2 in order to reduce its bipolar trigger voltage $V_{t1}$. Conductive member 520 forms gate 312 of multi-finger transistor N1. Trace 522 connects this gate to amplifier transistor P1 and control circuitry 304, not shown in this figure. Likewise, conductive member 524 forms the gate of multi-finger transistor N2. Drain contacts 530a–c are connected to pad 113 via conductive trace 531. Multi-fingered transistors N1 and N2 are interleaved, so the regions 530a and 530c form both drain 310 for transistor N1 and the drain for transistor N2. Source contacts 534a–534b connect source 314 of transistor N1 to $V_{SS}$ reference pad 107 via trace 536. Source contacts 542a and 542b connect the source of transistor N2 to P+ ring 350 via traces 544a–544d.

Figure 6:
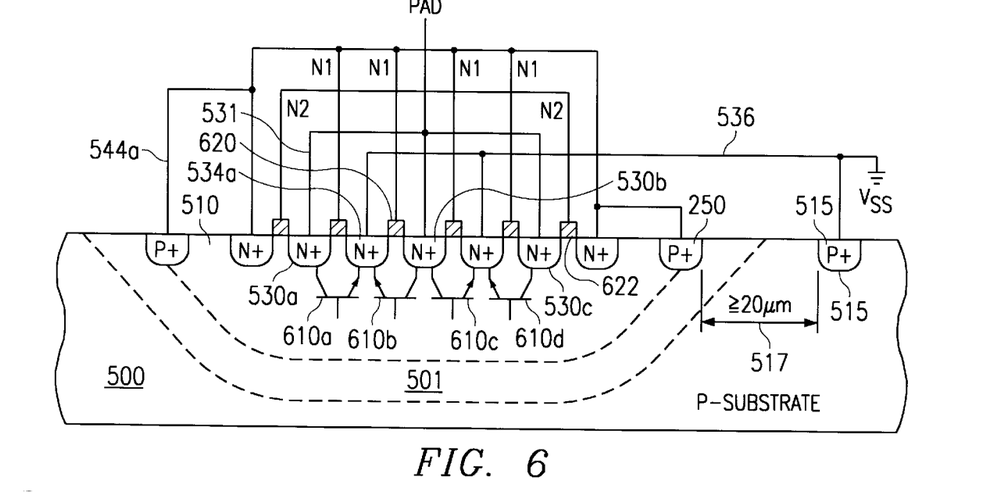
FIG. 6 shows cross sections of the devices illustrated in FIG. 5 with their parasitic lateral bipolar transistors.

FIG. 6 is a cross-sectional view of transistors N1 and N2 illustrating parasitic lateral bipolar transistors associated with N1. Only a portion of p-types semiconductor substrate 500 is depicted. Remaining circuitry of integrated circuit 10 is formed on portions of semiconductor substrate 500 not shown. P+ ring 350 encloses a region 510 of the semiconductor substrate. Substrate contacts, such as contact 515, are spaced apart from P+ ring 350 a distance 517 so that region 510 can be voltage pumped by pump transistor N2, as discussed earlier. Parasitic NPN transistors, generally indicated by 610a–d, corresponds to transistor N1. These parasitic transistors are triggered into conduction in response to an ESD zap on signal pad 113. Advantageously, gate oxide for transistor N1 and N2, indicated at 620 and 622 for example, is fabricated to have the same thickness as the gate oxide for transistors in the internal circuitry of integrated circuit 10. The backgates of transistors N1 and N2 located under gate oxide 620 and 622 are formed in enclosed substrate region 510. According to aspects of the present invention, voltage pumping of region 510 in response to an ESD zap helps turn on parasitic transistors 610a–d before the thin gate oxide of transistors N1 and N2 is damaged by the ESD zap.

Figure 7:
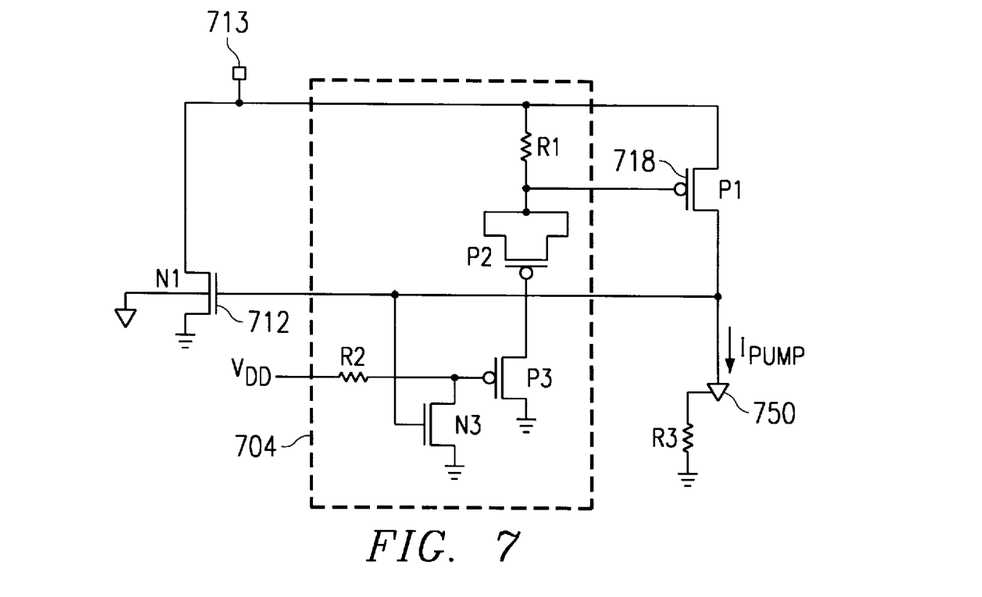
FIG. 7 is a schematic of an alternate embodiment of an ESD protection circuit, according to aspects of the present invention, in which the pump transistor and the amplifier transistor are combined.

FIG. 7 is a schematic of an alternative embodiment of an ESD protection circuit, according to aspects of the present invention. Amplifier transistor P1 operates similarly to amplifier transistor P1 of FIG. 3, except that drain 718 of amplifier transistor P1 is connected to P+ ring 750 via resistor R3 so that transistor P1 also provides pump current $I_{pump}$ to P+ ring 750 and thereby pumps an enclosed substrate region in which ESD device N1 is formed, as described above. Transistor P1 and resistance R3 are sized so that pump current $I_{pump}$ is in the range of 100–200 ma. Control circuitry 704 operates similarly to control circuitry 304. Resistance R3 does not need to be a discrete resistance; it can be intrinsic substrate resistance.

Still referring to FIG. 7, by using complimentary transistor P1 as both an amplifier and a pump transistor in place of pump transistor N2 of FIG. 3, signal pad 713 capacitance is advantageously reduced.

Figure 8:
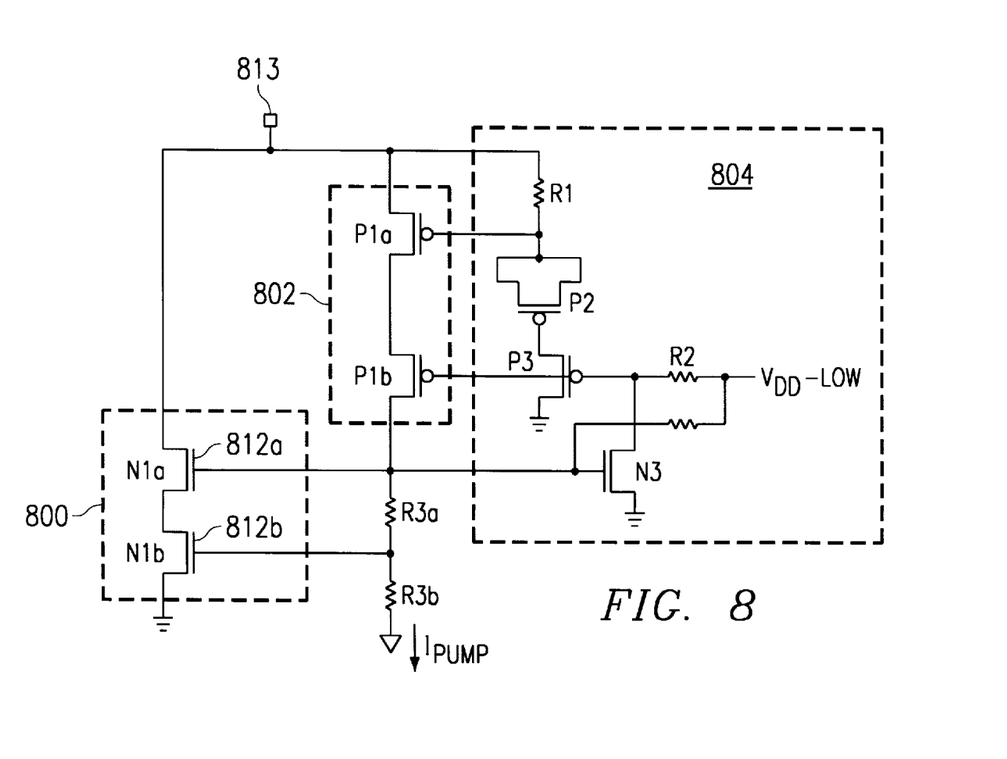
FIG. 8 is a schematic diagram of an alternative embodiment of the present invention in a high voltage tolerant integrated circuit using cascoded low voltage transistors.

FIG. 8 is a schematic diagram of an alternative embodiment of the present invention in a high voltage tolerant integrated circuit using cascoded low voltage transistors. Related U.S. patent application Ser. No. 09/325,527, (TI-27526) entitled "NMOS Triggered NMOS ESD Protection Circuit Using Low Voltage NMOS Transistors", is incorporated herein by reference and describes the use of low voltage transistors in an ESD protection circuitry for a high voltage signal pad. According to an aspect of the present invention, cascoded complimentary transistors P1a and P1b in conjunction with resistance R3a and R3b provide pump current $I_{pump}$ in the range of 100–200 ma so that cascoded ESD protection transistors N1a and N1b are rapidly triggered into bipolar conduction in response to an ESD zap. The term "cascode device" or "cascoded amplifier transistors" means a serial string of transistors connected in a source to drain fashion. Still referring to FIG. 8, during normal operation of internal circuitry of the integrated circuit, control circuitry 804 provides a gate bias to each of transistors N1a, N1b, P1a and P1b that does not exceed the allowable operating gate voltage for low voltage transistors. In this embodiment, $V_{dd\text{-}low}$ is 3.3 volts. Gate 812a of transistor N1 is held at approximately 3.3 volts, since $V_{DD}$ in this embodiment is 3.3 volts. Likewise, gate 812b of transistor N1b is held at approximately 0 volts such that transistors N1a and N1b are turned off. Advantageously, a gate-drain voltage Vgd across each of transistors N1a, N1b, P1a and P1b does not exceed 3.3 volts. Therefore, the string of transistors comprising gate coupled device 800 and the string of transistors comprising amplifier/pump circuitry 802 are advantageously made using the same gate oxide thickness as the transistors used within internal circuitry of the integrated circuit.

Suitable buffers for high voltage operation are described in U.S. patent application Ser. No. 60/114/268 (TI-25514) entitled "Method of Designing Fail-Safe CMOS I/O Buffers Whose External Nodes Accept Voltages Higher than the Maximum Gate Oxide Operation Voltage" incorporated herein by reference. An open collector style output buffer would have cascode N-channel transistor in the pull-down portion of the circuit, while a tri-state push-pull output circuit would have not only the cascode N-channel transistor in the pull-down portion of the circuit, but would also have a series or cascode connected P-channel transistor in the pull-up portion of the circuit. Cascode-connected transistors would be driven at their gate terminals by a bias supply circuit in order to maintain safe gate oxide voltage operating levels.

In another embodiment, an ESD protection circuit for a high voltage tolerant integrated circuit has separate amplifier transistors and pump transistors, similar to FIG. 3.

Fabrication of integrated circuit 10 involves multiple steps of implanting various amounts of impurities into a semiconductor substrate and diffusing the impurities to selected depths within the substrate to form transistor devices. Masks are formed to control the placement of the impurities. Multiple layers of conductive material and insulative material are deposited and etched to interconnect the various devices. These steps are performed in a clean room environment.

A significant portion of the cost of producing the data processing device involves testing. While in wafer form, individual devices are biased to an operational state and probe tested for basic operational functionality. The wafer is then separated into individual dice which may be sold as bare die or packaged. After packaging, finished parts are biased into an operational state and tested for operational functionality.

A CTNMOS ESD structure is advantageously more tolerant of Pwell profile and transistor parameters than an NTNMOS ESD structure. Also, there is more margin afforded to triggering a protection NMOS device in response to an ESD zap.

Advantageously, a CTNMOS ESD structure allows a smaller, lower capacitance, protection structure for same protection level as an NTMOS ESD structure.

Advantageously, voltage pumping of the gates and backgates of the ESD protection transistors in response to an ESD zap helps turn on parasitic transistors in the ESD protection circuitry before the thin gate oxide of ESD protection transistors is damaged by the ESD zap.

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. For example, circuits with lower values of $V_{DD}$ can be accommodated by including more than two transistors in the GCD and in the pumping circuitry strings. Transistors within the internal circuitry block and the ESD protection block can be sized to operate at voltages other than 5 volts by using an oxide thickness that will withstand the voltage during normal operation of the integrated circuit. The ESD transistors can have a different number of fingers than illustrated. The shape of the P+ ring and the enclosed region of semiconductor substrate can be varied. It is therefore contemplated that the appended claims will cover any such modifications of the embodiments as fall within the true scope and spirit of the invention.

What is claimed is:

1. An integrated circuit, comprising:

a semiconductor substrate with a bond pad for a reference supply voltage;

a bus for a first supply voltage;

a signal bond pad for connecting to an external signal;

internal circuitry connected between the first bus and semiconductor substrate comprising MOS transistors, wherein a signal line from the internal circuitry is connected to the first signal bond pad;

ESD circuitry connected between the signal pad and the reference supply voltage bond pad, wherein the ESD circuitry comprises:

a first substrate region in the semiconductor substrate enclosed by a highly doped region;

a first MOS transistor of a first conductivity type with a backgate in the first substrate region, a first source/ drain connected to the signal bond pad, a second source/drain connected to the reference supply voltage bond pad, and a control gate connected to the highly doped region;

a complimentary triggering MOS transistor of a second conductivity type with a first source/drain connected to the signal bond pad, a second source/drain connected to the highly doped region, and a control gate; and control circuitry operable to provide a control signal to the control gate of the complimentary triggering MOS transistor in response to an ESD zap applied to the first signal bond pad, wherein the control circuitry comprises a capacitor with a first plate connected to the reference supply bond pad and a second plate connected to the control gate of the complimentary triggering MOS transistor and a resistor with one end connected to the first signal bond pad and another end connected to the second plate of the capacitor.

2. The integrated circuit of claim 1, further comprising a second triggering MOS transistor of the first conductivity type inserted between the complementary triggering MOS transistor and the highly doped region, with a first source/drain connected to the signal bond pad, a second source/drain connected to the highly doped region and a control gate connected to the second source/drain of the complimentary triggering MOS transistor.

3. The integrated circuit of claim 1, wherein the first MOS transistor comprises a plurality of cascode connected MOS transistors, and the complimentary triggering transistor comprises a second plurality of cascode connected MOS transistors.

4. The integrated circuit of claim 1, wherein the control circuit further comprises a first switch transistor connected between the first plate of the capacitor and the reference supply bond pad, with a control gate connected to the first supply bus, operable to be open when a normal operating voltage is applied to the first supply voltage bus.

5. The integrated circuit of claim 4, wherein the control circuit further comprises a second switch transistor connected between the control gate of the first switch transistor and the reference supply bond pad with a control gate connected to the second source/drain of the complimentary triggering MOS transistor, operable to maintain the first switch transistor in a conductive state when the complimentary trigger MOS transistor is conducting in response to an ESD zap even if a voltage is applied to the first supply bus.

6. The integrated circuit of claim 1, further comprising a resistive connection between the highly doped region and the reference supply bond pad, such that a pump current provided by the complimentary triggering MOS transistor will pump up a voltage level in the first substrate region in response to the ESD zap.

7. The integrated circuit of claim 6, wherein the pump current is in the range of 100–200 milliamps.

8. A digital system comprising:

a first integrated circuit having an output buffer operable to provide an output signal on a first terminal having fist signal voltage level; and a second integrated circuit according to claim 1 having an output buffer with a signal bond pad connected to the first terminal.

9. A method for protecting an integrated circuit form an ESD pulse, the method comprising the steps of receiving an ESD pulse on a signal pad of the integrated circuit;

diverting an initial portion of the ESD pulse into a first substrate region enclosed by a highly doped region so that a voltage level in the first substrate region is pumped in response to the ESD pulse;

triggering a MOS transistor located in the first substrate region into snapback conduction in response to the pumped voltage level; and conducting a remaining portion of the ESD pulse through the MOS transistor.

10. The method of claim 9, wherein the step of diverting comprises the steps of amplifying the ESD pulse with a p-type MOS transistor and pumping the first substrate region with a source follower transistor connected to the p-type transistor.

* * * * *

UNITED STATES PATENT AND TRADEMARK OFFICE
CERTIFICATE OF CORRECTION

PATENT NO. : 6,147,538
DATED : November 14, 2000
INVENTOR(S) : Bernhard H. Andresen, Roger A. Cline It is certified that error appears in the above-identified patent and that said Letters Patent is hereby corrected as shown below:

Column 5,
Line 67, replace item "08/795,935" with -- 08/795,435, now Patent No. 5,940,258 -- under Related U.S. Application Data

Signed and Sealed this

First Day of January, 2002

Attest:

*Attesting Officer*

JAMES E. ROGAN
*Director of the United States Patent and Trademark Office*